(12) United States Patent
Gerber et al.

(10) Patent No.: US 6,300,183 B1
(45) Date of Patent: Oct. 9, 2001

(54) INDEPENDENTLY PROGRAMMABLE MEMORY SEGMENTS WITHIN A PMOS ELECTRICALLY ERASABLE PROGRAMMABLE READ ONLY MEMORY ARRAY ACHIEVED BY N-WELL SEPARATION AND METHOD THEREFOR

(75) Inventors: Donald S. Gerber, Gilbert; Randy L. Yach, Phoenix; Kent D. Hewitt, Chandler; Gianpaolo Spadini, Mesa, all of AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/272,675

(22) Filed: Mar. 19, 1999

(51) Int. Cl.[7] ............... H01L 21/8238; H01L 21/8242; H01L 21/336
(52) U.S. Cl. ............... 438/228; 438/227; 438/248; 438/279
(58) Field of Search .............. 365/185.06, 185.18, 365/185.01, 185.07; 438/3, 196, 227, 228, 248, 279, 587

(56) References Cited

U.S. PATENT DOCUMENTS

| | | | |
|---|---|---|---|
| 4,318,751 | * 3/1982 | Horng | 148/1.5 |
| 4,933,295 | * 6/1990 | Feist | 437/33 |
| 5,343,423 | 8/1994 | Shimoji | 365/182 |
| 5,521,105 | * 5/1996 | Hsu et al. | 437/41 |
| 5,736,764 | 4/1998 | Chang | 257/318 |
| 5,790,455 | 8/1998 | Caywood | 365/185.06 |
| 5,818,761 | * 10/1998 | Onakado et al. | 365/185.18 |
| 6,072,212 | * 6/2000 | Kaya et al. | 257/315 |

FOREIGN PATENT DOCUMENTS

| 11 003595 A | 1/1999 | (JP) . |
|---|---|---|
| 11 177069 A | 7/1999 | (JP) . |

* cited by examiner

Primary Examiner—Amir Zarabian
Assistant Examiner—Adam Pyonin
(74) Attorney, Agent, or Firm—Baker Botts L.L.P.

(57) ABSTRACT

An array of P-channel memory cells is separated into independently programmable memory segments by creating multiple, electrically isolated N-wells upon which the memory segments are fabricated. The methods for creating the multiple, electrically isolated N-wells include p-n junction isolation and dielectric isolation.

6 Claims, 6 Drawing Sheets

INDEPENDENTLY PROGRAMMABLE MEMORY SEGMENTS WITHIN A PMOS ELECTRICALLY ERASABLE PROGRAMMABLE READ ONLY MEMORY ARRAY ACHIEVED BY N-WELL SEPARATION AND METHOD THEREFOR

BACKGROUND OF THE INVENTION

1. Field of the Invention

This invention relates generally to the fabrication of semiconductor devices. Specifically this invention identifies an enhancement of P-channel Electrically Erasable Programmable Read Only Memory (EEPROM)(hereinafter memory) devices as disclosed by the prior art wherein the device is segmented into independently programmable memory sub-arrays. Thus, the present invention is an improvement on the semiconductor memory devices disclosed by the prior art.

2. Description of the Related Art

The relevant prior art is identified as U.S. patent application Ser. No. 08/890,415 filed Jul. 9, 1997 and issued as U.S. Pat. No. 5,986,931, entitled "Low Voltage Single Supply CMOS Electrically Erasable Read-Only Memory" which is a continuation-in-part of U.S. patent application Ser. No. 08/78,315, filed Jan. 2, 1997 and issued as U.S. Pat. No. 5,790,455. U.S. Pat. No. 5,986,931 (Caywood 2) and U.S. Pat. No. 5,790,455 (Caywood 1) are incorporated by reference. cells over a P-well substrate because of a simpler manufacturing process and lower programming voltages. The Caywood approach produces precisely the opposite configuration, i.e. P-channel devices over an N-well, which itself resides in a P-type substrate. The novelty of the Caywood approach is the reduction in magnitude of the applied voltage required for erasing and writing to the device while maintaining a similar writing speed as found in the art prior to Caywood as well as the elimination of certain components functionally necessary in the prior art.

Referring to FIG. 1, the N-channel memory device art prior to Caywood is illustrated. Each memory transistor (MEM) required a row select transistor (SEL), which controlled the data received from the bit lines (BL). Also, if byte addressing was desired, then the device included a byte select transistor (BYTE) for every eight memory transistors. The problem solved by Caywood with the advent of P-channel/N-well device was the elimination of the row select transistors. Even after Caywood, byte selection still required the presence of the byte select transistors. The elimination of the byte select transistors resulted in the undesirable effect that the entire row must be reprogrammed following an erase operation.

Referring to FIG. 2, the Caywood approach is illustrated in general terms for a single memory transistor 1. The N-well 3 is created within a P-type substrate 2. The P-channel for the drain 4 and source 5 is created within the N-well 3. Poly 1 or the floating gate 6 of the memory transistor 1 is created after the active region for the drain 4 and source 5. Poly2 or the control electrode 7 of the memory transistor is fabricated over the floating gate. Various non-conductive layers 8 insulate the P-channel 4 and 5, the floating gate 6 and the control electrode 7 from each other.

FIG. 3 illustrates a plurality of cell rows 100, typically connected to gate electrodes of memory transistors and a plurality of columns 200 typically connected to source and drain electrodes of memory transistors in the array, with both cell rows and cell columns existing on a single N-well 300 substrate. The limitation to the Caywood P-channel memory arrays, as shown in FIG. 3, is that all memory cells in any particular row must selected, thus written or erased, during a particular operation.

Alternatively stated, in the prior art as disclosed by Caywood, the cell rows are not segmented such that some memory cells in the cell row may be selected for writing while other memory cells in the row are not. Thus, in order to program the contents of a single memory cell, the entire cell row must then be programmed in order to change the data in one memory cell.

In many applications it is desired to change the data in the memory array, one byte at a time. In the N-channel device prior art, this feature was accomplished by the inclusion of a byte select transistor (BYTE) for each eight memory transistors as shown in FIG. 1. The disadvantage of this approach is the increased demand for silicon area to accommodate the overhead of the byte select transistor (BYTE). For example, from solely a transistor perspective, a byte select transistor (BYTE) for every eight memory transistors requires an 11% overhead (i.e. ⅑).

Moreover, the capability of changing one byte at a time would give an endurance advantage over row select memory arrays because only one byte of cells would need to undergo the electrical stress of the programming cycle as opposed to the entire row. It is well known to those skilled in the art of semiconductor memory fabrication that one cause of EEPROM failure is attributable to excessive erase/write operations.

Therefore a need exists to provide a technique whereby the advantages of P-channel/N-well EEPROM technology are maximized by providing independently programmable memory segments within the EEPROM array other than with byte select transistors.

BRIEF SUMMARY OF THE INVENTION

It is an object of the present invention to provide a P-channel/N-well electrically erasable programmable read only memory array that is divided into independently programmable memory segments.

It is another object of the present invention to provide a plurality of independently programmable memory segments within a memory array by fabricating a plurality of N-wells within the substrate of the array or by segmenting the N-well of the array into sub-wells.

It is another object of the present invention to provide a Pchannel/N-well electrically erasable programmable read only memory device with independently programmable memory segments without the necessity for byte select transistors.

It is another object of the present invention to provide one or more methods for creating a plurality of N-wells or segmenting the N-well of the array. One method of creating a plurality of N-wells within a substrate is referred to as p-n junction isolation. A method for segmenting the N-well of the memory array is referred to as dielectric isolation.

In accordance with one embodiment of the present invention, a memory array comprises a plurality of N-wells within a P-type substrate and a plurality of independently programmable memory segments. Each independently programmable memory segment is comprised of M memory cell columns and N memory cell rows. Each independently programmable memory segment resides within a unique and separate N-well. Thus, each N-well contains an independently programmable memory segment.

The method of creating the plurality of N-wells within the P-type substrate comprises the steps of growing a buffer oxide on a P-type substrate, applying photoresist to the buffer oxide, etching the photoresist to form a plurality of N-well channels and implanting N-wells via the N-well channels.

In accordance with another embodiment of the present invention, a memory array comprises an N-well within a P-type substrate wherein the N-well is segmented in to a plurality of electrically isolated sub N-wells, M memory transistor columns within each of the plurality of electrically isolated sub N-wells and N memory transistor rows within each of the plurality of electrically isolated sub N-wells.

The method of fabricating the sub-wells from a single N-well comprises the steps of implanting a P-type substrate to form a single N-well, applying photoresist over the single N-well, etching the photoresist to form a plurality of apertures, etching a plurality of trenches via the plurality of apertures with a trench depth which exceeds that of the N-well and which penetrates the P-type substrate to form a plurality of electrically isolated sub N-wells, and filling the plurality of trenches with an insulating material wherein the insulating material prevents electrical conduction as between each of the plurality of electrically isolated sub N-wells.

The foregoing and other objects, features, and advantages of the invention will be apparent from the following, more particular, description of the preferred embodiments of the invention, as illustrated in the accompanying drawings.

DETAILED DESCRIPTION OF THE INVENTION

Figure 4:
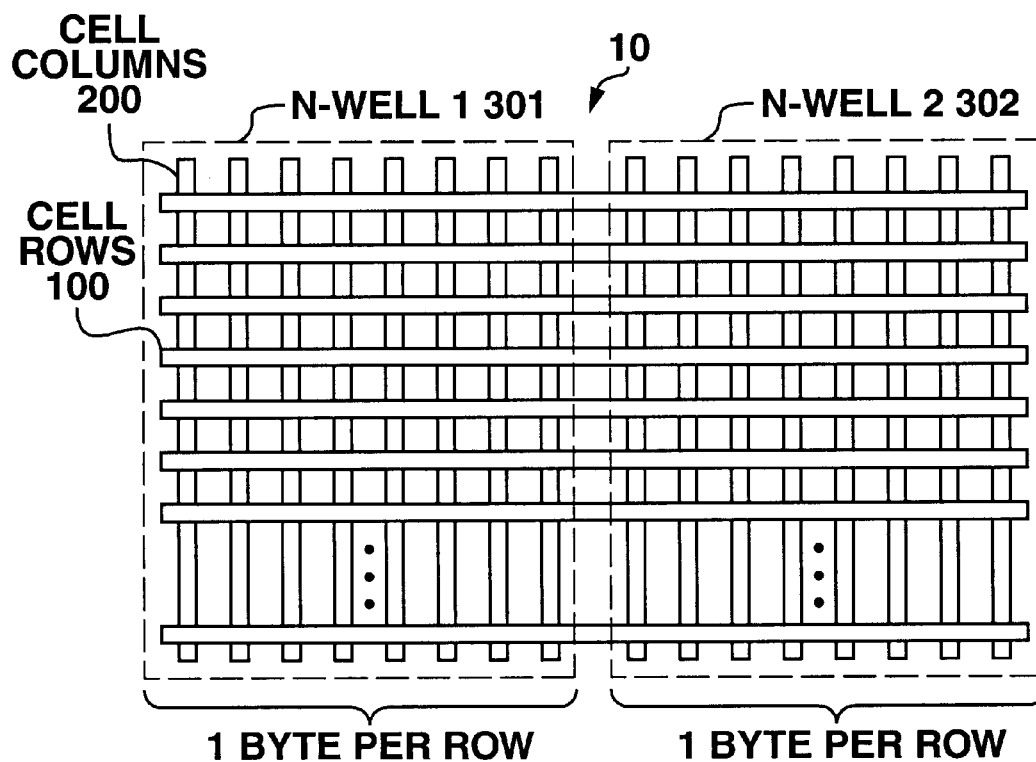
FIG. 4 is an illustration of the present invention illustrating a P-channel memory array comprising two N-wells with each N-well having an independently programmable memory segment.

Referring to FIG. 4, a P-channel memory array 10 comprising a plurality of N-wells within a P-type substrate and a plurality of independently programmable memory segments is shown. Each independently programmable memory segment is comprised of a matrix of memory cell transistors shown as cell rows 100 and cell columns 200. The embodiment of FIG. 4 segments the 16 cell columns 200 and the plurality of cell rows 100 of the memory array 10 into two independently programmable memory segments residing within N-wells 301 and 302, respectively and shown in dashed lines. N-wells 301 and 302 are electrically separated from each other.

In the preferred embodiment, there are eight memory transistor columns within each N-well segment, thereby comprising byte segments. There are a common number of cell rows 100 within each N-well and the total number of rows 100 is determined by the desired size of the memory array 10. In FIG. 4, N rows of memory to transistors are illustrated. Not shown in FIG. 4, but discussed below and shown in subsequent diagrams, are select transistors for assisting in control of the operation of the array 10.

In the embodiment of FIG. 4 only two N-wells and two independently programmable memory segments are shown in byte format, i.e. 8 cell columns per memory segment, or a total of 16 cell columns. However, those skilled in the art will recognize that additional N-well segmentations are possible thus yielding additional independently programmable memory segments in byte format. Thus, for a byte format memory array 10, the number independently programmable memory segments multiplied by eight, i.e. the number of cell columns 200 per memory segment, equals the total number of cell columns 200 in the array 10.

Furthermore, each of the independently programmable memory segments which may be comprised of M cell columns, where M is either smaller or larger than a byte. The number of cell columns M 200, alternative to the byte format, include, but are not limited to: 2, 4, 16, 32 and 64 cell columns 200 for each independently programmable memory segment. These various memory array 10 geometries are easily implemented by the methods discussed below.

Figure 5:
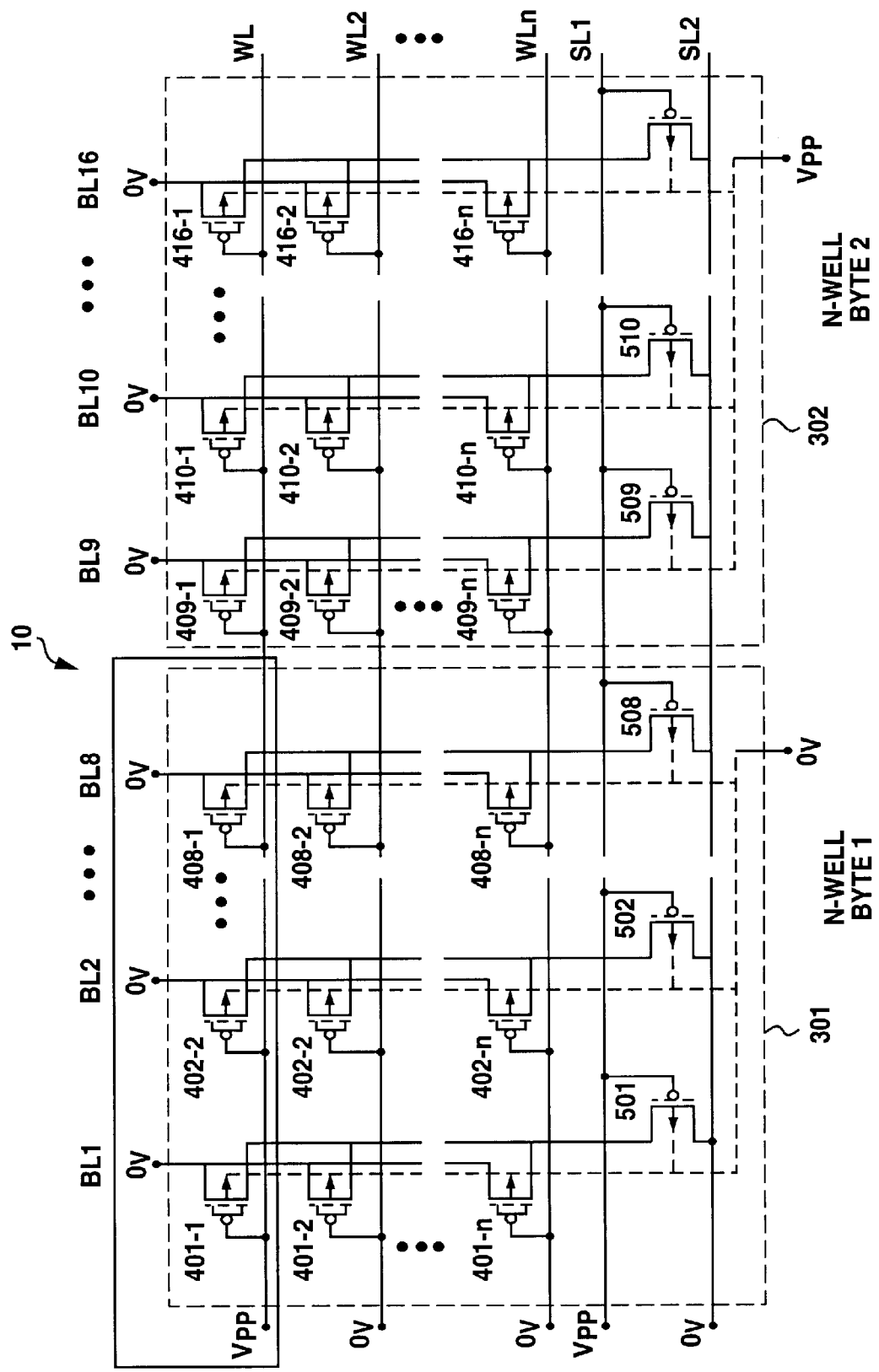
FIG. 5 is a schematic diagram of the present invention for a write operation.
Figure 6:
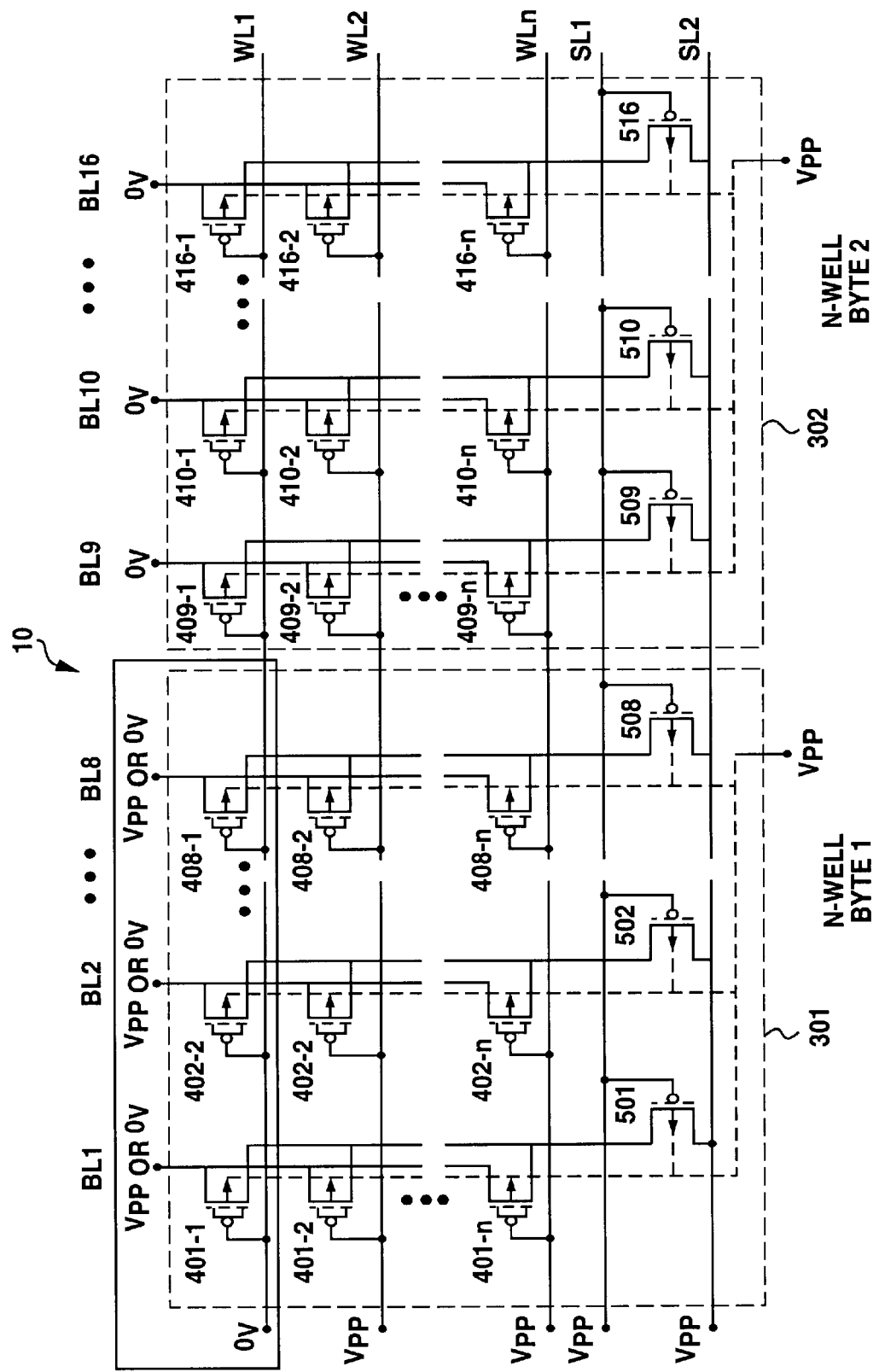
FIG. 6 is a schematic diagram of the present invention for an erase operation.
Figure 7:
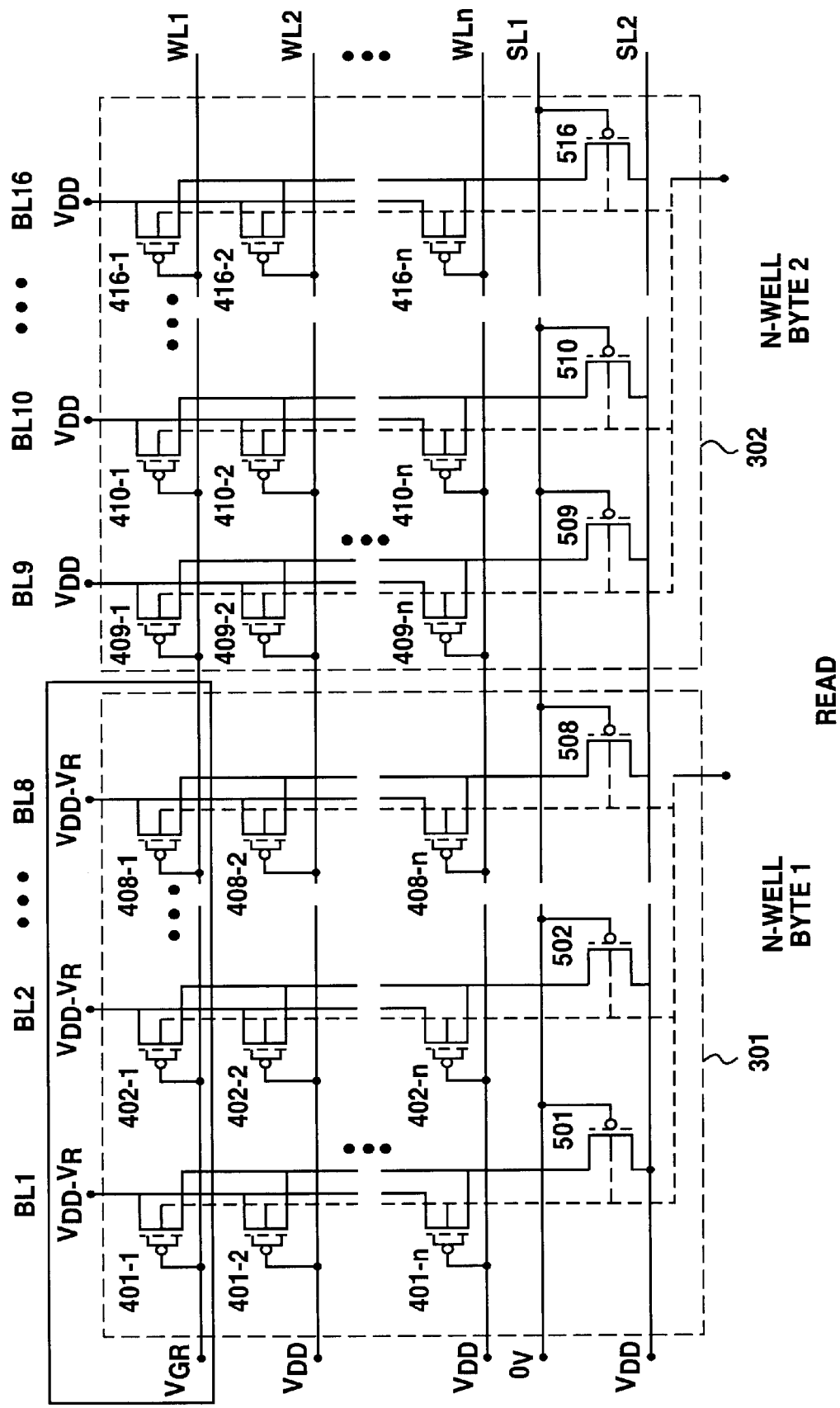
FIG. 7 is a schematic diagram of the present invention for a read operation.

Each independently programmable memory segment is comprised of a plurality of independently programmable memory units. An independently programmable memory unit is defined as those cell columns 200 which are common to a given cell row 100 and within a single independently programmable memory segment. The intersection of a cell column 200 and a cell row 100 defines a memory cell which may be a single memory transistor as illustrated in FIGS. 5–7. Thus, for the geometry defined by FIG. 4, each independently programmable memory unit is comprised of eight memory cells. Furthermore, the total number of independently programmable memory units for a given independently programmable memory segment is equal to the total number (N) of cell rows 100.

The functional relevance of the independently programmable memory unit is as follows. A single independently programmable memory unit defines the smallest or most narrow portion of the memory array 10 that may be addressed by the write and erase memory operations described below. Additionally, all independently programmable memory units within a common cell row 100 may be simultaneously addressed by the write and erase memory operations.

Referring to FIG. 5, a write operation of the present invention is illustrated for the two byte segmentation embodiment of FIG. 4. Note that the present invention as illustrated in FIG. 5, eliminates the byte select transistors which were necessary in the NMOS prior art. The row select circuitry is outside of the memory array 10. The "pass gate," sometimes referred to as the "select gate" transistor is merged into the memory cell, which is referred to as a "split cell."

In this application, as in the prior art, the IEEE standard 1005 will be followed for consistent nomenclature. Writing or programming a device is defined as placing electrons, i.e. a charge, onto the floating gate of the memory transistor. Erasing is defined as removing electrons from the floating gate. The memory array 10 is comprised of a plurality of P-channel memory transistors 401-1 to 416-n which are laid out in a typical column/row matrix. Also shown are a row of P-channel source select transistors 501–516. Only one source select transistor 501–516 is necessary for each bit line BL1–BL16.

Two separate N-wells with accompanying independently programmable memory segments are shown in dashed lines drawn around a group of cells. Contained within N-well 301 are 8 memory transistor columns (only three are shown for clarity) and N memory transistor rows. N-well 302 is identical to N-well 301, however, N-well 302 is electrically isolated from N-well 301. Note that each independently programmable memory segment corresponds to an N-well and thus, the quantity of N-wells is equal to the quantity of independently programmable memory segments. The upper left independently programmable memory unit in N-well 301 is enclosed in a solid line box to indicate that this is the target independently programmable memory unit (i.e. target byte) for the write, erase, and read operations described below.

The control electrodes of the P-channel memory transistors 401-1 to 416-n for each row are connected to a common word line (WL). For a write operation, the word line may be either at ground potential, i.e. zero volts, or at some relatively high programming voltage $V^{PP}$, i.e. typically 12–20 volts. For writing to the target independently programmable memory unit (i.e. target byte), the control electrodes of memory transistors 401-1 to 416-1 are driven to $V^{PP}$ via WL1. The electric field resulting from a relatively high $V^{PP}$ voltage, in combination with the N-well 301 biased to ground potential as described below, causes electrons to tunnel from the N-well across the dielectric layer and onto the floating gate of the transistor, thus programming, i.e. writing, the transistor.

Conversely, using WL2 as an example, the N-well 301 and the control electrodes of memory transistors 401-2 to 408-2 are set to ground potential or zero volts. Under these conditions, no tunneling occurs because of an absence of an electric field. Thus, memory transistors 401-2 to 408-2 are not programmed, i.e. written to.

With respect to memory transistors 409-2 to 416-2, the N-well 302 is at $V_{pp}$ and the control electrodes are ground potential which results in a P-type inversion layer under the poly2 layer of each of the memory cells 409-2 to 416-2. With BL9-16 set to zero volts and the drain electrodes of memory transistors 409-2 to 416-2 tied to the inversion layer, there is no voltage potential between the control electrode and the inversion layer at the surface of the N-well 302. Thus, even with the N-well biased to $V^{PP}$, no tunneling occurs thereby precluding a write operation for memory transistors 409-2 to 416-2.

The drain electrodes of the memory transistors of any particular column are connected to a common bit line (BL). For a write operation, the bit line to each of the columns BL1:8 and BL9:16 are set a zero volts.

The source electrodes of each memory transistor in a particular column are commonly connected to a source select transistor 501–516. The source select transistors 501–516 are controlled by two select lines, SL1 and SL2. For a write operation, SL1 is set to $V^{PP}$ and SL2 is set to ground potential.

Figure 1:
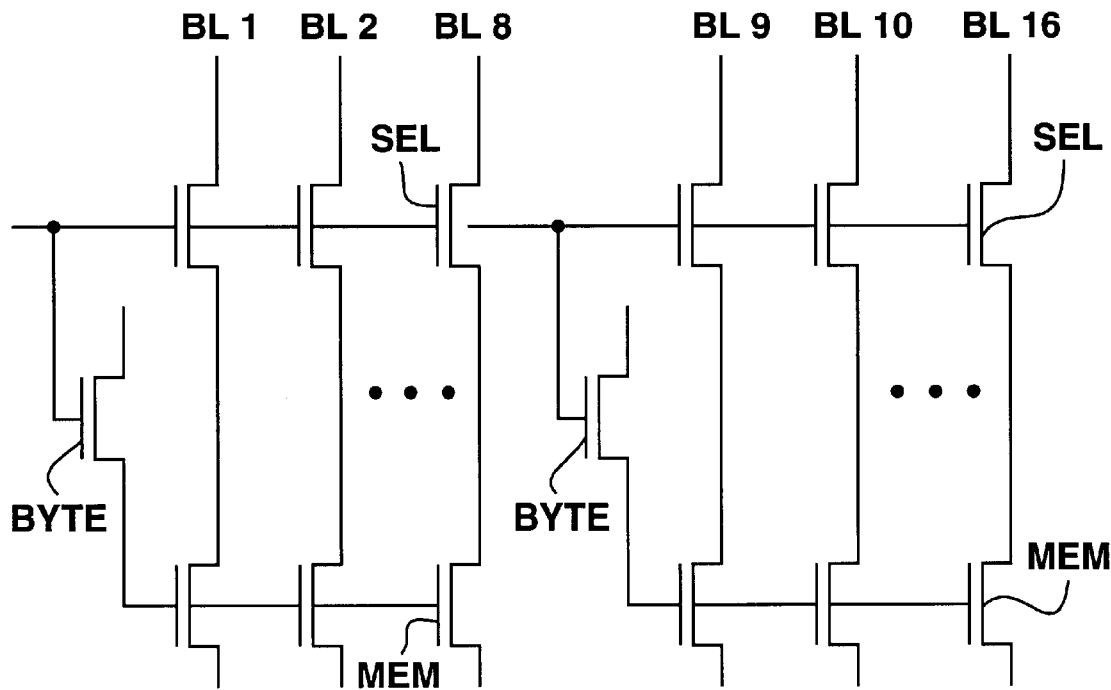
FIG. 1 is a schematic diagram of byte selectable N-channel memory cells in the prior art incorporating byte select transistors and row select transistors.
Figure 2:
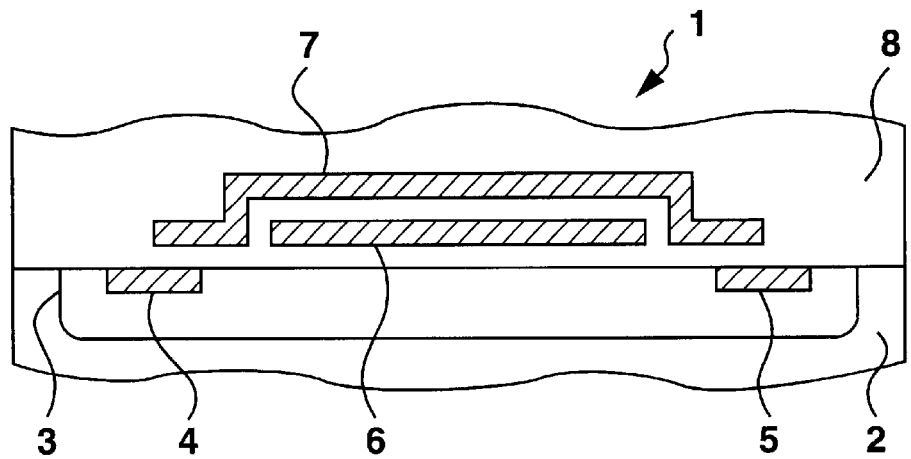
FIG. 2 is a cross section of a P-channel memory transistor.
Figure 3:
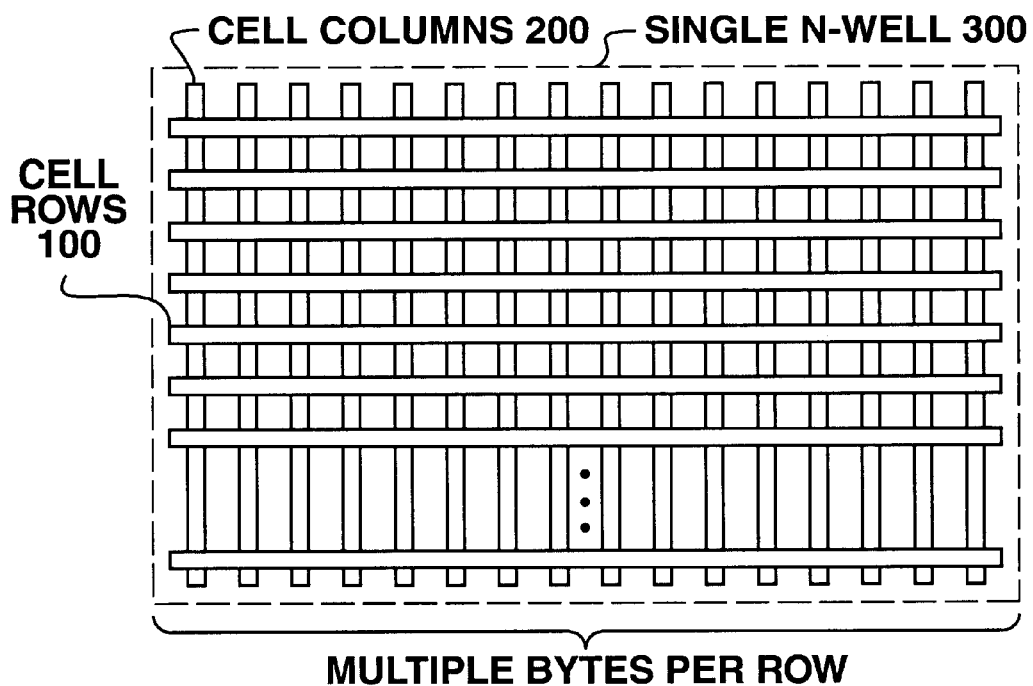
FIG. 3 is an illustration of the prior art in which the matrix of P-channel memory transistors resides in a single N-well.

In the write operation as illustrated in FIG. 5, the N-well 301 is biased to ground potential. This permits a sufficient voltage potential between the floating gate of the memory transistors 401-1 to 408-1, controlled by WL1 and the N-well 301. Electrons tunnel from the N-well 301 across the dielectric layer to the floating gate where a charge is deposited, thus effecting the write cycle (refer to FIG. 2).

Conversely, N-well 302 is biased to $V^{PP}$, thereby failing to create the sufficient voltage potential between the control electrodes of the memory transistors 409-1 to 416-1 that are within N-well 302. Without a sufficient voltage differential, tunneling cannot occur and the write cycle is not accomplished. Thus, by providing for separate and isolated N-wells, the P-channel memory transistors in any row may be organized in byte selectable segments where byte selection is effected, at least in part, by the application of, or biasing at, different voltage potentials, the plurality of the N-wells themselves.

Referring to FIG. 6, an erase operation is described for a byte selectable memory array 10. In this example, word line WL1 is set to ground potential, which capacitively couples the floating gate of memory transistors 401-1 to 416-1 to a low voltage and turns the transistors on hard, thereby creating an inversion layer. The remainder of the word lines WL2:n, the select lines SL1:2 and N-wells 301 and 302 are biased to $V_{pp}$. Bit lines BL1:8 for N-well 301 are set to $V^{PP}$ which biases the inversion layer under the floating gate to $V^{PP}$. This causes electron tunneling from the floating gate to the inversion region in the N-well 301 and serves to remove the charge from the floating gate of the memory transistors 401-1 to 408-1 (refer to FIG. 2).

Conversely, with WL1 and BL9:16 set to ground potential, the inversion layer for memory transistors 409-1 to 416-1 is biased to zero volts which results in electron tunneling not occurring. Thus, there the erase operation is not accomplished for memory transistors 409-1 to 416-1. In the target independently programmable memory unit (i.e. target byte) of FIG. 6, identified by the bolded rectangle, a binary pattern may be entered in to the memory cells 401-1 through 408-1 by setting bit lines BL1–BL8 to either zero volts or Vpp. Bit lines set to $V^{PP}$ will erase the memory cell. Bit lines set to zero volts will remain in the write or programming state.

Referring to FIG. 7, a read operation is described for a byte selectable memory array 10. In this example, WL1 is set to VGR, a voltage between $V^{DD}$ and ground, sufficient to turn on memory transistors 401-1 to 416-1. Word lines WL2:n are set to $V^{DD}$ (typically 5 volts) which turn off the remainder of the memory transistors. The N-wells 301 and 302 are also set to $V^{DD}$ which is a normal "body bias" for a P-channel transistor in CMOS technology. SL1 is set to ground potential, thereby turning on the source select transistors. SL2 is set to $V^{DD}$ which permits the select transistors to source current. With the above conditions set, the bit lines BL1:16 are left to control the read operation. To read the target independently programmable memory unit, BL1:BL8 are set to $V_{DD-VR}$ ($V_R$ is a range 1.0 to 1.5 volts) which creates a voltage potential between the source and drain of the memory transistors resulting a current which is read by the sense amplifiers (not shown). BL9:16 are set to $V^{DD}$, thereby not creating the requisite voltage potential between source and drain and thus, inhibiting the memory read of that byte.

There are various processing methods which can be used to create a plurality of N-wells or to segment the N-well into sub-wells. Two such methods include p-n junction isolation and dielectric isolation. An example of each of these methods is provided below.

Figure 8:
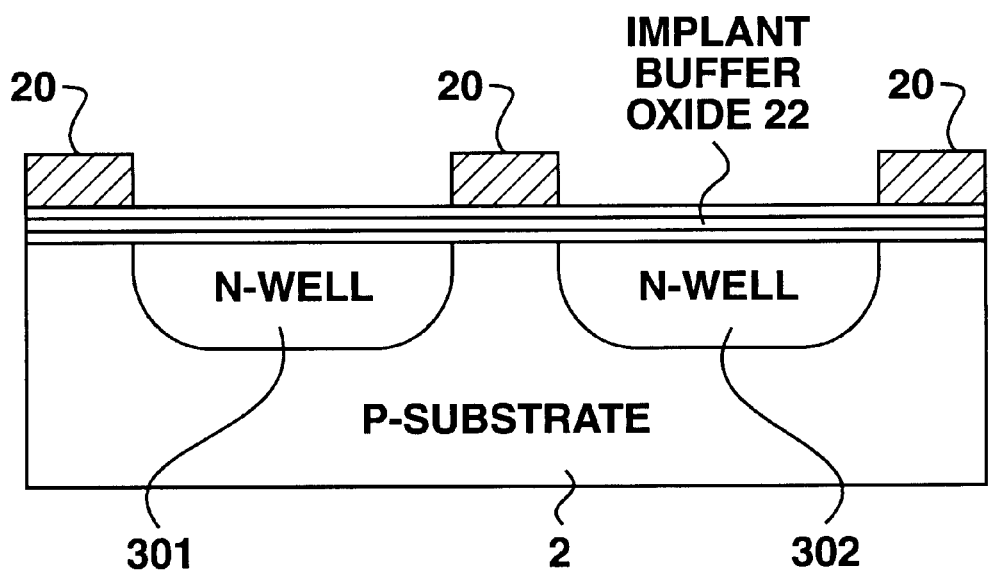
FIG. 8 is a cross section of the implantation method of plural N-well fabrication.

One form of p-n junction isolation makes use of a photoresist mask to implant separate N-well regions located within the P-type substrate at the time well formation occurs. FIG. 8 illustrates the result of this process before the photoresist 20 is removed. The process begins with a P-substrate 2 upon which an implant buffer oxide 22 is grown. Next the photoresist 20 is applied and etched to form the channels for the implant. Following the etching of the photoresist 20, the formation of the two N-wells 301 and 302 by implantation occurs. The photoresist 20 is then removed and the remainder of the device is fabricated.

The N-wells 301 and 302 are isolated from one another due to the p-n junction formed with the P-substrate in which they are implanted. To allow closer spacing of N-wells with the implantation process, P-type material may be implanted between the N-wells to increase the doping concentration between the implants. This will reduce the extent of the lateral N-well diffusion and decrease the width of depletion regions into the P-type material. Typically, a thick field oxide would be formed between active regions in the N-wells and would exist over the P-type region between the N-wells.

Figure 9:
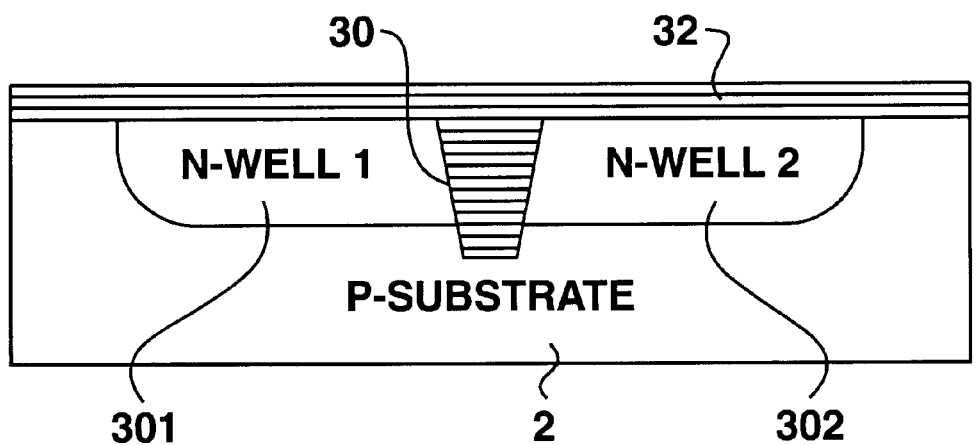
FIG. 9 is a cross section of the trenching method of N-well segmentation.
Figure 3:
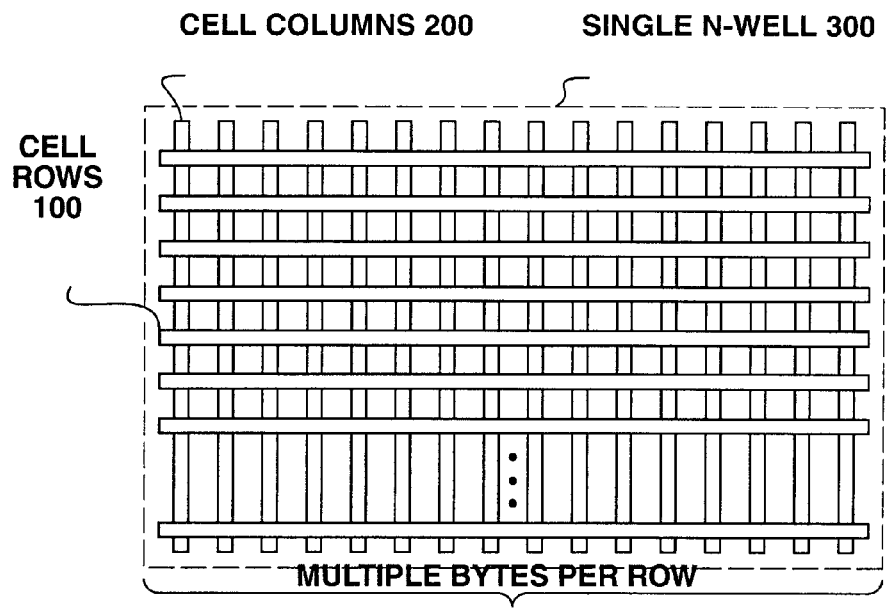
Figure 4:
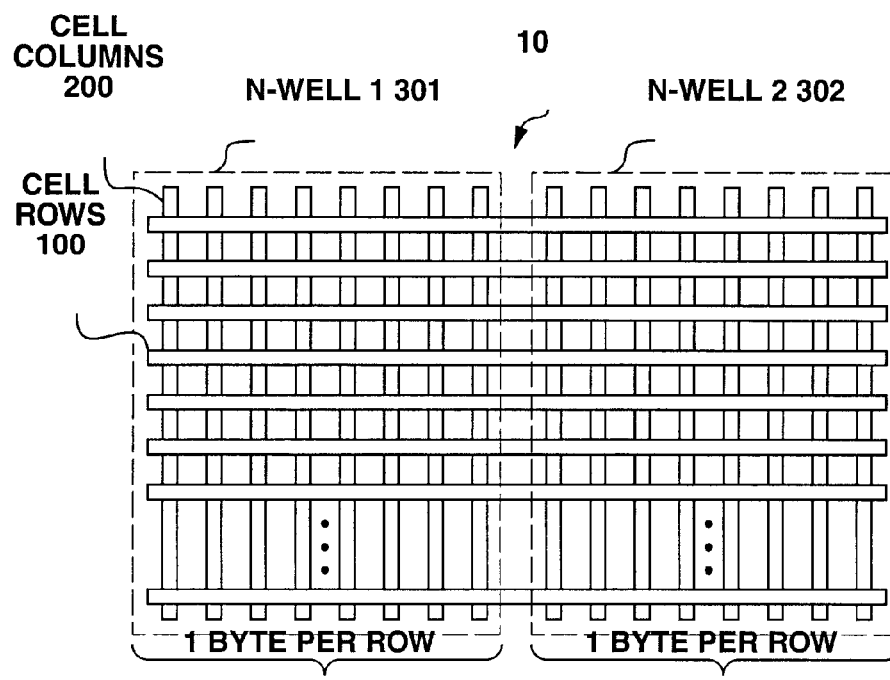

Referring to FIG. 9, trench etch and dielectric fill is an example of the dielectric isolation method for creating multiple sub-wells 301a and 302a from an original, single N-well and minimizing the spacing between the sub-wells. In this case, the sub-wells 301a and 302a are separated by first forming one large N-well and then etching a deep trench 30 into the silicon substrate 2 to divide the N-well into the requisite number and size sub-wells. The side walls of the trenches may require implants and oxidation, or other passivation steps, to achieve good electrical characteristics for the junctions which abut them. The trenches are then filled with insulating material 32 or a combination of materials that prevent electrical conduction between the various N-wells.

Although the invention has been particularly shown and described with reference to a preferred embodiment thereof, it will be understood by those skilled in the art that changes in form and detail may be made therein without departing from the spirit and scope of the invention.

What is claimed is:

1. A method of creating a memory array comprising a plurality of N-wells within a P-type substrate, and a plurality of independently programmable memory segments, wherein each of the plurality of independently programmable memory segments resides within a unique and separate one of the plurality of N-wells, comprising of the steps of:

providing a P-type substrate;

growing a buffer oxide on the P-type substrate;

applying photoresist to the buffer oxide;

etching the photoresist to form a plurality of N-well channels; and implementing N-wells via the N-well channels.

2. A method of creating a plurality of N-wells located within a P-type substrate for a memory array comprising the plurality of N-wells within the P-type substrate, a plurality of independently programmable memory segments, wherein each of the plurality of independently programmable memory segments resides within a unique and separate one of the plurality of N-wells, comprising the steps of:

providing a P-type substrate;

growing a buffer oxide on the P-type substrate;

applying photoresist to the buffer oxide;

etching the photoresist to form a plurality of N-well channels; and implanting N-wells via the N-well channels.

3. A method of creating a plurality of N-wells located within a P-type substrate comprising the steps of:

growing a buffer oxide on a P-type substrate;

applying photoresist to the buffer oxide;

etching the photoresist to form a plurality of N-well channels;

implanting N-wells via the N-well channels; and forming an independently programmable memory segment in each N-well.

4. A method of fabricating a memory array comprising an N-well located within a P-type substrate wherein the N-well is segmented into a plurality of electrically isolated sub-wells, M memory cell columns within each of the plurality of electrically isolated sub-wells, N memory cell rows within each of the plurality of electrically isolated sub-wells, and a row of selected transistors within each of the plurality of sub-wells, comprising the steps of:

implanting a P-type substrate to form a single N-well;

applying photoresist over the single N-well;

etching the photoresist to form a plurality of apertures;

etching a plurality of trenches via the plurality of apertures with a trench depth which exceeds that of the N-well and which penetrates the P-type substrate to form a plurality of electrically isolated sub-wells; and filling the plurality of trenches with an insulating material wherein the insulating material prevents electrical conduction as between each of the plurality of electrically isolated subwells.

5. A method of fabricating a plurality of sub-wells for a memory array comprising an N-well located within a P-type substrate wherein the N-well is segmented into the plurality of electrically isolated sub-wells, M memory cell columns within each of the plurality of electrically isolated sub-wells, N memory cell rows within each of the plurality of electrically isolated sub-wells, and a row of selected transistors within each of the plurality of sub-wells, comprising the steps of:

implanting a P-type substrate to form a single N-well;

applying photoresist over the single N-well;

etching the photoresist to form a plurality of apertures;

etching a plurality of trenches via the plurality of apertures with a trench depth which exceeds that of the N-well and which penetrates the P-type substrate to form a plurality of electrically isolated sub-wells; and filling the plurality of trenches with an insulating material wherein the insulating material prevents electrical conduction as between each of the plurality of electrically isolated sub-wells.

6. A method of segmenting an N-well located within a P-type substrate into a plurality of electrically isolated sub-wells, comprising the steps of:

implanting a P-type substrate to form a single N-well;

applying photoresist over the single N-well;

etching the photoresist to form a plurality of apertures;

etching a plurality of trenches via the plurality of apertures with a trench depth which exceeds that of the N-well and which penetrates the P-type substrate to form a plurality of electrically isolated sub-wells;

filling the plurality of trenches with an insulating material wherein the insulating material prevents electrical conduction as between each of the plurality of electrically isolated sub-wells, and placing a row of selected transistors within each of the plurality of sub-wells.

\* \* \* \* \*

UNITED STATES PATENT AND TRADEMARK OFFICE
CERTIFICATE OF CORRECTION

PATENT NO. : 6,300,183 B1
DATED : October 9, 2001
INVENTOR(S) : Gerber et al.

It is certified that error appears in the above-identified patent and that said Letters Patent is hereby corrected as shown below:

<u>Drawings,</u>
On Sheet 2 of 6, Figure 4, Figure 4 is not prior art, therefore, the legend
" (PRIOR ART) " should not appear in association with this drawing Figure 4.
Attached is a corrected drawing Figure 4, without the incorrect " (PRIOR ART) " legend.

Signed and Sealed this

Twenty-third Day of July, 2002

*Attest:*

*Attesting Officer*

JAMES E. ROGAN
*Director of the United States Patent and Trademark Office*